Sept. 20, 1966 J. L. BOYER ET AL 3,274,458

EXTREMELY HIGH VOLTAGE SILICON DEVICE

Filed April 2, 1964

INVENTORS
JOHN L. BOYER
FRANK W. PARRISH

BY

OSTROLENK, FABER, GERB & SOFFEN
ATTORNEYS

United States Patent Office 3,274,458
Patented Sept. 20, 1966

3,274,458

EXTREMELY HIGH VOLTAGE SILICON DEVICE

John L. Boyer and Frank W. Parrish, El Segundo, Calif., assignors to International Rectifier Corporation, El Segundo, Calif., a corporation of California Filed Apr. 2, 1964, Ser. No. 356,716
13 Claims. (Cl. 317—234)

This invention relates to a novel housing construction for extremely high voltage semiconductor devices having junctions therein, and more specifically relates to a novel shield structure for increasing the break-down voltage in the interior of an extremely high voltage device.

Devices using semiconductor wafers having one or more junctions therein are well known to those skilled in the art and include devices such as diodes, controlled rectifiers, and the like. In these devices the wafer is generally contained within some suitable housing which is hermetically sealed and contains a gas, fluid, or solid dielectric medium. As the rating and voltage capability of these devices increase, it has been found that there will be break-down, for example, of the gas within the hermetically sealed unit, particularly where the junctions withstand voltages of the order of 2,000 volts.

The principle of the present invention is to provide a novel housing structure which improves the break-down characteristics between electrodes without increasing spacing and thus retaining short heat flow paths. More particularly, the break-down voltage of the electrodes which are separated by an insulator is greately influenced by the geometry of the negative electrode at the junction within the wafer with respect to the insulator. The type of gas used for sealing the unit as well as pressure thereof will also have an important influence on the break-down voltage.

In accordance with the present invention, a novel shielding structure is provided for shielding the silicon wafer and the insulator structure while the capsulation medium is formed of some suitable high dielectric, high pressure gas such as sulfur hexafluoride.

Where the invention is applied to a negative stud-type device, the surface of the wafer is electrostatically shielded by an annular ring having smooth surfaces and which is interposed between the wafer and the outer insulation support cylinder. In the case of a positive stud device, a disk-shaped conductive shield is placed atop the wafer to shield the negative silicon junction. Where the wafer has a plurality of junctions for use, for example, as a controlled rectifier, then both types of shields are used, since the upper portion of the wafer may assume high negative or positive potentials.

Accordingly, a primary object of this invention is to provide a novel housing structure for semiconductor devices which permit a substantial improvement in their voltage break-down characteristics.

Another object of this invention is to provide a novel shield structure for shielding a semiconductor wafer contained within an enclosed housing for increasing the junction break-down voltage of the wafer.

Another object of this invention is to increase the voltage rating of a semicondutor wafer device by encapsulating the device in a high pressure, high dielectric constant gas.

These and other objects of this invention will become apparent from the following description when taken in connection with the drawings, in which.

Figure 1:
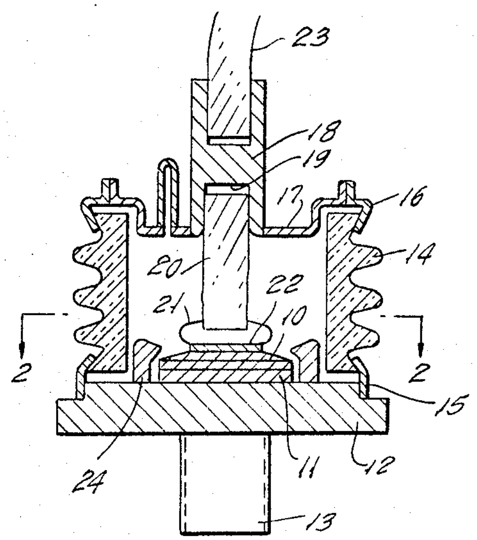
FIGURE 1 shows a side cross-sectional view of a semiconductor device and housing therefor constructed in accordance with the present invention.

Referring now to the drawings, I have illustrated therein a semiconductor device which includes a suitable wafer 10 which may, for example, be of silicon and may have one or more junctions therein to define a diode or controlled rectifier, or the like. The wafer 10 has a conductive electrode 11 at the bottom thereof which is directly thermally and electrically connected to the base stud 12 which may be of copper and has an extending threaded stud portion 13.

A hollow insulator 14 then has metallic rings 15 and 16 secured thereto through any well-known method for forming a ceramic-to-metal joint.

The ring 16 is then brazed to a hollow disk 17 which has a central opening therein to receive the bottom end of conductive adapter member 18. The adapter member 18 has a central elongated opening 19 therein which is mechanically and electrically secured to a flexible conductive pigtail 20. The conductive pigtail 20 may then terminate in an electrostatic shielding disk 21 which has smooth outer surfaces, and is electrically connected to the upper surface of wafer 10 by means of a conductive soldering disk 22. The upper end of adapter 18 then has a second opening extending therein for receiving the external pigtail conductor 23.

Assuming that the device 10 is a wafer having a single junction therein, it is then seen that one side of the junction is electrically connected to base stud 12, while the other side of the junction is connected to terminal 23, these two terminals being insulated from one another by the insulator 14.

Figure 2:
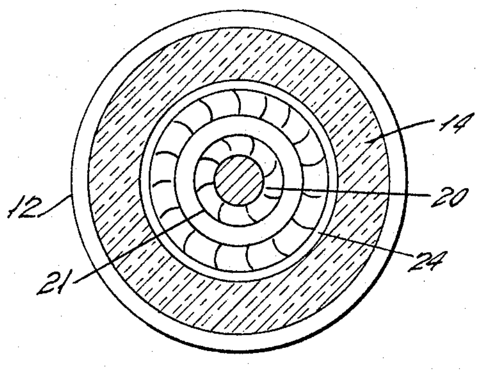
FIGURE 2 is a cross-sectional view of FIGURE 1 taken across the lines 2—2 in FIGURE 1.

In order to increase the voltage capability of the device, the housing structure described in FIGURES 1 and 2 is preferably filled with some suitable high pressure gas having a high dielectric constant such as sulphur hexafluoride.

Further in accordance with the invention, a novel shield structure is provided such as the shield member 21 along with a second shield in suitable cases such as the ring-shaped shield 24.

Where the device of FIGURE 1 is to be a negative stud diode, the upper surface of silicon wafer 10 will be electrostatically shielded by ring 24 which also will shield the ceramic insulator 14. In this application, it is not necessary to use the disk 21, and pigtail 20 may be connected directly to conductive disk 22.

In the case of a positive stud diode, the electrode 21 will act to shield the negative silicon junction in device 10, while ring 17 will shield the ceramic insulator 14.

In the case of a controlled rectifier where the upper portion of the wafer can assume a very high positive potential or very high negative potential, then both shields 21 and 24 are preferably used.

Although this invention has been described with respect to its preferred embodiments, it should be understood that many variations and modifications will now be obvious to those skilled in the art, and it is preferred therefore that the scope of the invention be limited not by the specific disclosure herein, but only by the appended claims.

The embodiments of the invention in which an exclusive privilege or property is claimed are defined as follows:

1. A high voltage semiconductor device comprising a wafer of semiconductor material having at least one junction therein, a conductive support base for said wafer and being connected to one surface portion of said wafer, an insulation cylinder having one end thereof mechanically connected to said conductive support base, and an upper terminal structure electrically connected to a surface portion of said wafer opposite to said one surface portion and mechanically connected to the opposite end of said insulation cylinder; said mechanical connection between said one end and said opposite end of said insulation cylinder to said conductive support base and said upper terminal structure defining a hermetically sealed housing for said wafer; and a corona shield; said corona shield comprising a conductive ring surrounding the upper periphery of said wafer and being connected to said conductive base, said conductive ring being radially interposed between said upper periphery of said wafer and said insulation cylinder.

2. A high voltage semiconductor device comprising a wafer of semiconductor material having at least one junction therein, a conductive support base for said wafer and being connected to one surface portion of said wafer, an insulation cylinder having one end thereof mechanically connected to said conductive support base, and an upper terminal structure electrically connected to a surface portion of said wafer opposite to said one surface portion and mechanically connected to the opposite end of said insulation cylinder; said mechanical connection between said one end and said opposite end of said insulation cylinder to said conductive support base and said upper terminal structure defining a hermetically sealed housing for said wafer; and a corona shield; said corona shield comprising a conductive disk having rounded edges; said conductive disk being positioned adjacent said surface portion of said wafer opposite to said one surface portion and shielding portions of said last mentioned surface portion from said upper terminal structure.

3. A high voltage semiconductor device comprising a wafer of semiconductor material having at least one junction therein, a conductive support base for said wafer and being connected to one surface portion of said wafer, an insulation cylinder having one end thereof mechanically connected to said conductive support base, and an upper terminal structure electrically connected to a surface portion of said wafer opposite to said one surface portion and mechanically connected to the opposite end of said insulation cylinder; said mechanical connection between said one end and said opposite end of said insulation cylinder to said conductive support base and said upper terminal structure defining a hermetically sealed housing for said wafer; and a corona shield; said corona shield comprising a conductive ring surrounding the upper periphery of said wafer and being connected to said conductive base, said conductive ring being radially interposed between said upper periphery of said wafer and said insulation cylinder; and a second corona shield; said second corona shield comprising a conductive disk having rounded edges; said conductive disk being positioned adjacent said surface portion of said wafer opposite to said one surface portion and shielding portions of said mentioned surface portion from said upper terminal structure.

4. The device substantially as set forth in claim 1 wherein said hermetically sealed housing is filled with a high dielectric gas at high pressure.

5. The device substantially as set forth in claim 2 wherein said hermetically sealed housing is filled with a high dielectric gas at high pressure.

6. The device substantially as set forth in claim 3 wherein said hermetically sealed housing is filled with a high dielectric gas at high pressure.

7. In combination; a wafer of semiconductor material, a housing for enclosing said wafer, and a corona shield; said housing comprising a first and second conductive portion and an insulation portion mechanically connecting and insulating said first and second conductive portions from one another; said wafer having first and second opposing surfaces connected to said first and second conductive portions respectively; said corona shield comprising a conductive body having rounded surface portions; said conductive body rounded edges being electrically connected to one said first or second conductive portions of said housing and being interposed between said wafer and the other of said first or second conductive portions of said housing.

8. The device substantially as set forth in claim 7 wherein said conductive body is ring-shaped and surrounds and is spaced from the periphery of said wafer.

9. The device substantially as set forth in claim 7 wherein said body is a flattened sphere positioned adjacent said first surface of said wafer.

10. The device substantially as set forth in claim 8 wherein said housing is filled with a high dielectric gas under high pressure.

11. The device substantially as set forth in claim 9 wherein said housing is filled with a high dielectric gas under high pressure.

12. The device substantially as set forth in claim 7 wherein said body is a flattened sphere positioned adjacent said second surface of said wafer.

13. The device substantially as set forth in claim 12 wherein said housing is filled with high dielectric gas under high pressure.

No references cited.

LEWIS H. MYERS, *Primary Examiner.*